United States Patent [19]

Yasuda et al.

[11] 4,042,861
[45] Aug. 16, 1977

[54] MOUNTING ARRANGEMENT FOR AN INTEGRATED CIRCUIT UNIT IN AN ELECTRONIC DIGITAL WATCH

[75] Inventors: Tetuya Yasuda, Tokyo; Yoshio Iinuma, Higashimurayama; Yuzo Maekawa, Fuchu, all of Japan

[73] Assignee: Citizen Watch Company Limited, Tokyo, Japan

[21] Appl. No.: 521,532

[22] Filed: Nov. 6, 1974

[30] Foreign Application Priority Data

| Nov. 8, 1973 | Japan | 48-128590 |
| Nov. 8, 1973 | Japan | 48-128591 |
| Nov. 8, 1973 | Japan | 48-129592 |
| Apr. 1, 1974 | Japan | 49-36734 |
| Jan. 31, 1974 | Japan | 49-12480 |

[51] Int. Cl.² .................................................. H05K 1/04
[52] U.S. Cl. .................................. 361/400; 58/23 R; 361/398
[58] Field of Search ...... 317/101 F, 101 CC, 101 CP; 58/23 R; 174/DIG. 3; 313/50, 51; 315/169 TV

[56] References Cited

U.S. PATENT DOCUMENTS

| 3,404,215 | 10/1968 | Burks et al. | 174/DIG. 3 |
| 3,480,836 | 11/1969 | Aronstein | 317/101 CP |
| 3,544,857 | 12/1970 | Byrne et al. | 317/101 CP |
| 3,549,782 | 12/1970 | Reifel | 174/DIG. 3 |
| 3,670,639 | 6/1972 | Harnden | 317/101 F |
| 3,702,953 | 11/1972 | Fauth et al. | 317/101 CP |
| 3,718,842 | 2/1973 | Abbott et al. | 317/101 F |
| 3,778,999 | 12/1973 | Vuffray | 58/23 R |
| 3,873,889 | 3/1975 | Leyba | 317/101 F |

*Primary Examiner*—David Smith, Jr.

[57] ABSTRACT

An integrated circuit block assembly is provided with a base plate, a printed base carrying thereon a connecting and wiring pattern and a number of electrodes for connection with those on an integrated circuit chip, fine metallic wires, each being connected to one of the electrodes on said chip with one of said connecting electrodes on said printed base, an insulated protector for protecting said chip and said wires. In this assembly, the chip carries a large scale integrated circuit and the printed base is a flexible printed circuit sheet having a connecting pattern connected to a display means or other functional element.

3 Claims, 18 Drawing Figures

MOUNTING ARRANGEMENT FOR AN INTEGRATED CIRCUIT UNIT IN AN ELECTRONIC DIGITAL WATCH

BACKGROUND OF THE INVENTION

This invention relates broadly to a electronic digital watch movement with an illuminating time display mechanism. More specifically, it relates to mounting mechanism for an integrated circuit block as the electronic heart of the watch movement, in combination with a plurality of components cooperating with said block, providing a high density and highly reliable assembly of these mutually related constituents in the watch movement.

DESCRIPTION OF THE PRIOR ART

With modern and rapid development of the electronic technology, integrated circuit blocks or chips have found their broad use in various engineering fields. While dimensional and power requirements of these chips have substantially been satisfied for various practical purposes, much is desired, however, towards further improvements in the outline dimensions of the package of the chip in combination with several related constituents of the watch movement, as well as in the practical formation and arrangement of a large number of electrical connections included therein.

In the modern watch movement fitted with a full electronic drive and time-display system, requiring small as possible overall sizes, especially of the integrated circuit block package, and dense as possible arrangement of its numerous electrically contacting terminals and elements formed thereon, various and profound endevors have been made towards the realization of an idealized and smaller sized package of the above kind which is easier to manufacture and assemble, more reliable in its operation, yet bearing rather various connecting terminal means easily connectable with cooperating mating parts of other assemblying blocks of the watch movement.

As an example of the prior art, there is known the lead so called frame system. In this case, a frame sheet made of a conductive material and having a number of connecting arms is firstly punched out from a film web and these arms are connected through respective short fine wires to respective and exposed electrodes of the IC-block or chip and then the frame proper is cut down from these arms. Further, these arms are bonded to respective connecting parts of related and cooperating electronic and electric blocks. Finally, the chip, wire leads and connecting arm strips are molded into a mass by means of a hardenable resin material.

As a further known technique, a conductive paste is printed and baked on a ceramic or the like board, so as to provide a printed circuit board having a number of connecting strips, and the board is fixedly assembled with an IC-chip. The said connecting strips are then utilized as the out-going and in-coming terminal means of the thus assembled IC-block. If necessary, these strips are connected to the desired portions outside of the IC-block, through respective bonded wire leads.

As a further example of prior art, the "Minimod" system is known with the name of General Electric Company, 1 River Rd., Schenectady 5, N.Y., which represents a unique IC-chip assembly mode, as shown and described in Japanese Opened Patent Application No. Sho46-2109, opened Oct. 11, 1971 to public inspection.

However, these known IC-chip assembly modes leave more to be desired, when considering the following desirous five requirements to be satisfied, although the meaning is given only in the relative sense:

1. easiness in manufacture;
2. reliability in operation;
3. capability of providing a large number of connecting terminal means;
4. small overall dimensions; and
5. easiness in electrical connection of said numerous terminal means with other related and cooperating terminal or other means.

As an example, the lead frame system can provide desired numerous connecting terminal means, but is very difficult to satisfy the small dimension requirement. With the printing and baking system above described, difficulty will be encountered in the electrical connection with other parts outside of the IC-block assembly. Further, with the Minimod system, certain difficulty will possibly be encountered in the manufacturing easiness and the operational reliability under occasion and according to our manufacturing conditions.

In the full electronic watch movement of the above kind, employing a high density IC-block assembly, the liquid crystal cell covers substantially whole area of one side of the movement. At the opposite side of the movement, the power battery must be provided, and thus, the IC-block assembly should be provided in the remaining available space at the same side of the movement. The cell and battery are overlapped when seen in the direction of the thickness of the movement and a large number of connecting strips or the like members must be provided between the cell and battery for the completion of the necessary multiple electric connections to the cell. According to our manufacturing experience, the thickness dimensions of these connections play a decisive moment in the determination of the overall thickness of the movement and therefore, they must have least possible dimensions. According to a standard mode of the flat package technique with use of the lead flame system, various connecting leads extend from each of the four sides of IC-block assembly, the extending leads being turned in two stages substantially at right angles which requires a voluminous space in the movement for the arrangement thereof in position.

SUMMARY OF THE INVENTION

An object of the present invention is to provide a full electronic digital watch movement which is fitted with an IC-block assembly capable of satisfying the aforementioned five requirements.

A further object is to provide a watch movement of the above kind which is fitted with an IC-block assembly highly stable against outside mechanical shocks.

In the present invention, a flexible sheet made of non-conductive synthetic resin material is formed on its one surface with a pattern of connecting strips formed by the printing and etching technique. A rectangular space enough covering the surface area of an IC-chip is clearly off at least of the said conducting pattern. Under occasion and most preferably, said rectangular area forms an opening perforated through the sheet proper. The flexible sheet carrying the conductive connection pattern is fixedly attached to a base plate, comparative of the conventional pillar plate in the mechanical watch, of the watch movement, by glueing as a most preferable way. The extreme inner ends of the constituent conductive strips of the pattern serve as a kind of electrodes connected through conductive fine metal wires, and preferably respective connecting means arranged on a ceramic board, with respective exposed electrodes on the IC-chip.

The said inner ends of said conductive strips may preferably extend into said rectangular opening of the flexible sheet, so as to provide a kind peculiar connectors. In this case, these flexible and spacially isolated strip ends are bonded with respective connecting means, each being shaped into a channel in its section, arranged on and along the side edge portions of the ceramic board.

The clip is fixedly attached to any one of said three constituents or more specifically, the base plate, the cleared-off area of the flexible sheet or the ceramic board, by glueing as a representative and preferable measure.

A protector, made preferably of a hollow rectangular cup of ceramic or glass material, or a molded mass of synthetic resin, is provided for the protection of said chip and connecting fine metal wires, and occasionally the inner end portions of said conductive strips on the flexible sheet. The opposite or outer ends of said conductive strips are electrically connected with corresponding exposed electrodes on a liquid crystal cell.

These and further objects, features and advantages of the invention will become more apparent when read the following detailed description of the invention by reference to the accompanying drawings illustrative of several preferred embodiments of the invention.

DETAILED DESCRIPTION OF PREFERRED EMBODIMENTS

Figure 1:
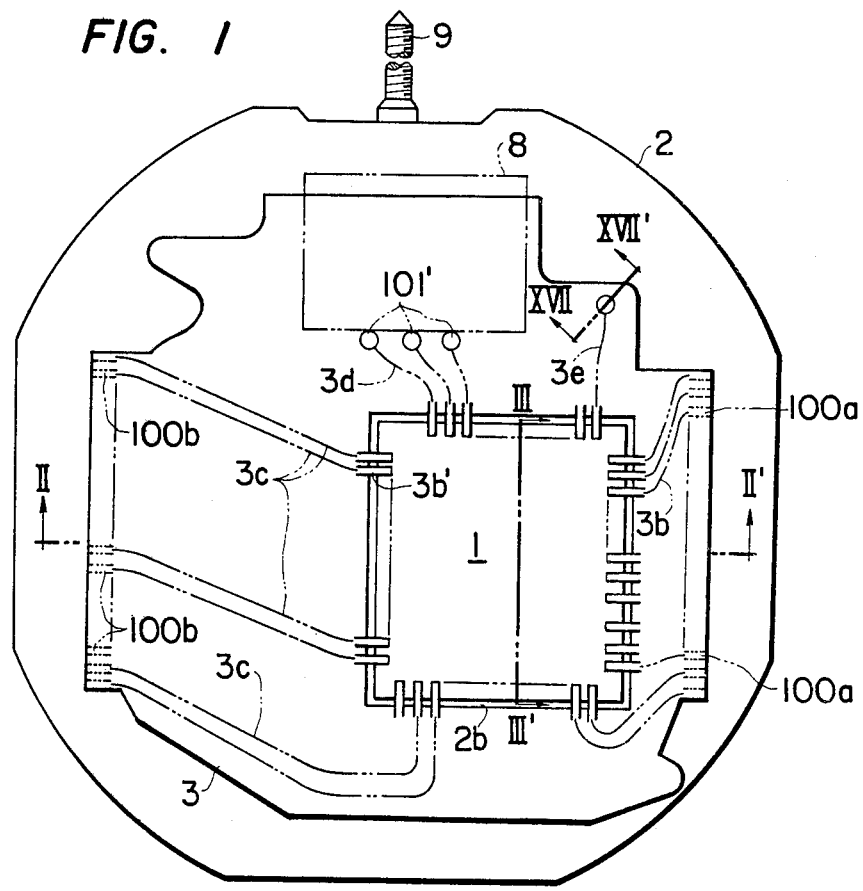
FIG. 1 is an enlarged schematic plane of essential parts of a first embodiment of the invention.
Figure 2:
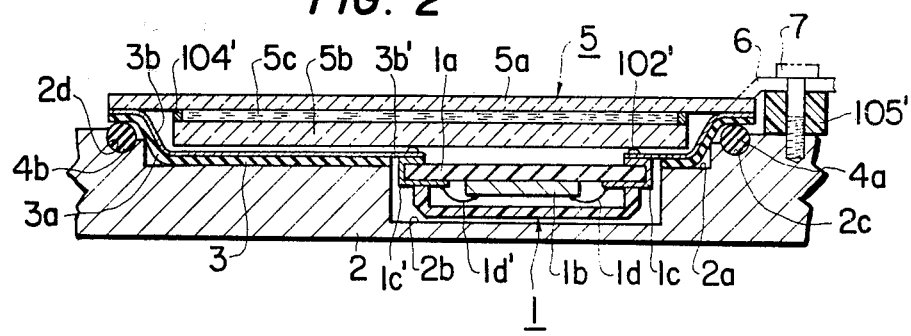
FIG. 2 is a cross section of the first embodiment shown in FIG. 1, taken along a section line II—II' shown therein.
Figure 3:
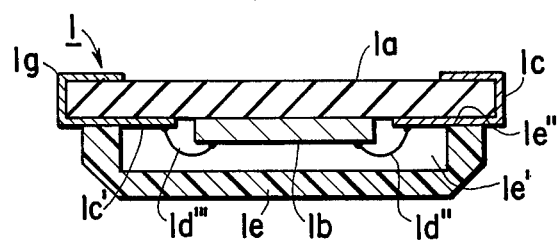
FIG. 3 is a section, somewhat enlarged, of part of the first embodiment shown in FIG. 1, taken in the perpendicular to the sectional plane shown in FIG. 2 and along a section line III—III' shown in FIG. 1.

Referring now to FIGS. 1-3, numeral 1a represents a rectangular ceramic board, to the lower surface of which a large scale integrated circuit chip, abbreviated LS-IC chip, 1b, is fixedly attached as conventionally by glueing by means of, for instance, epoxy resin.

The chip 1b has a rectangular configuration, its plan view 4, 1 mm × 4,5 mm, as an example, when seen in its plan view, although not shown. In FIG. 2, a shorter side of the chip is seen, while, in FIG. 3, a longer side thereof is visible.

Fourteen separate electrodes are formed on the lower surface of the chip and arranged in the form of comb teeth along each of the shorter sides of the chip 1b. In the similar way, fifteen separate electrodes are formed and arranged along each of the longer sides of the chip. Although not shown, this comb electrodes arrangement will be easily understood by reference to the similar arrangement of connectors 1c; 1c' formed on the ceramic board 1a which arrangement is seen in FIG. 1. As may easily be supposed from the foregoing, the electrodes on the chip 1b and the connectors on the ceramic board 1a respresent one-to-one correspondence.

The connectors 1c; 1c' have been formed into a conductive thick film layer, respectively, in three printing steps, so as to cover a shorter portion of the upper surface, the side edge and a longer portion of the lower surface of the ceramic board 1a, substantially in the form of a channel shape, as seen from FIGS. 2 and 3. The lower and longer arm of the channel of each of the out-going connectors 1c is bondedly connected through a metal wire 1d of Au, Al or the like conducting material with a corresponding one of the electrodes on the chip 1b.

Further similar connectors 1c' of channel shape are provided on the peripheral area of the ceramic board 1a, the each of the lower and longer arms of said connectors being electrically connected through a similar bonded metal wire 1d' to a corresponding one of the electrodes on the chip 1b.

Numeral 1e represents a ceramic rectangular protector having a hollow inside space 1e' and bonded by its ring-shape root portion 1e'' directly onto the lower surface of the ceramic board 1a or indirectly thereto through the intermediary of connectors 1c; 1c' and the like to be described. As seen, the chip 1b and metal leads 1d; 1d' are sealed-in within the inside space 1e' of said hollow protector 1e, for the protection of them from adverse effect of atmospheric moisture and foreign matter. The bonding of the protector to the board 1a is carried out by means of fused low temperature melting glass, as a preferred example. In this way, essential working parts of the IC-block, generally shown at 1, comprising said board 1a, chip 1b, connectors 1c; 1c', connecting leads 1d; 1d' and protector 1e, are effectively protected by the latter and in the above sense, and against damaging outside forces which may be applied to the block during assembly thereof into an electronic digital watch movement to be described.

Numeral 2 represents a base plate, only partly shown in section in FIG. 2 and in its full outline configuration in FIG. 1, of the watch movement, said base plate being formed with a first larger and shallower recess 2a and a second rectangular and deeper recess 2b formed within the area of said first recess.

Numeral 3 represents a flexible and non-conductive base sheet made, preferably of polyester, polyimide or the like resin material 3a and carrying thereon several groups of conducting strips 3b; 3c; 3d and 3e, represented only schematically and in a highly simplified form by chain-dotted lines. The formation of these conductive strips has been made by the etching technique. The first group 3b of said conductive printed strips is intended to electrically connect the connectors 1c with a first terminal group 100a, respectively, formed on the flexible resin sheet proper 3a and arranged in a comb teeth style along the right hand straight side of the sheet, as shown only schematically and in an abbreviated manner with chain-dotted lines in FIG. 1. The second group 3c of said conductive printed strips are intended to electrically connect the connectors 1c' with a second terminal group 100b, respectively, formed on the sheet proper 3a and arranged again in a comb teeth style along the left hand straight side of the sheet, as shown in the similar manner as above in FIG. 1.

Along the lower side edge of the ceramic board 1a, FIG. 1, similar connectors 1c; 1c' are provided. In the similar way, similar connectors 1g are provided along the upper side edge of the board 1a, FIG. 1, some of these connectors 1g are electrically connected through respective conductive printed strips 3d to a switch block 8 adapted for correction and erasure of illuminating time display under the manual control of a manipulating stem 9 made similar to the conventional winding stem in a mechanical watch. Since this switch block 8 does not constitute in any way part of the invention, it has been represented only in a schematic rectangular block shown in chain-dotted line. This block 8 is fixedly attached to the lower side of the base plate 2 by means of fixing screws, not shown, and several connecting spots of the block are connected through insulated pins 101' assing through said plate 2, with outer ends of said strips 3d, although not specifically shown. On the other hand, several of said connectors 1g are earthed through respective conductive strips 3e to the base plate 2, as will be later more fully described by reference to FIG. 17.

Each of the conductive printed strips 3b, 3c, 3d and 3e has an inwardly extending flexible extension, representatively shown as at 3b' in FIGS. 1 and 2, said extension being soldered or bonded with the upper and shorter arm of a corresponding one of said channel-shaped connectors 1c, 1c' and 1g.

It will be seen that these strip extensions 3b' serve as current-conducting means between the IC-block and the flexible sheet 3 carrying the wiring printed pattern. The IC-block 1 is substantially housed within the second recess 2b of the base plate 2, for reducing its occupying space in the watch movement.

A pair of semi-circular grooves 2c and 2d are formed in parallel with each other on the upper surface of base plate 2 and perpendicular to the plane of FIG. 2, for receiving respective elastic bars 4a and 4b, made preferably of rubber and adapted for resiliently supporting the related side edge portions of the printed flexible sheet from below.

Numeral 5 represents generally a liquid crystal cell which comprises a liquid crystal mass 5c housed between an upper and lower protecting glass plates 5a and 5b, as commonly used as the illuminatable time display means of the digital electronic watch movement. The liquid crystal mass 5c is sealed at its rectangular periphery by fused glass seal 104'. As seen, substantial part of liquid crystal cell 5 is housed in the first shallower recess 2a for reducing the overall occupying space of the watch movement and mounted resiliently at its both sides, when seen in FIG. 2, on the resilient supporting bars 4a and 4b through the flexible printed sheet 3.

Although not shown, the upper glass plate 5a is provided with printed strip leads extending from the liquid crystal mass 5c to corresponding terminal groups to those denoted 100a and 100b for conductive pressure contact therewith.

As shown schematically by chain-dotted lines at the right-hand side of FIG. 2, a non-conductive or insulated pressure member 6 is provided for pressurized positioning of the upper glass plate 5a together with other cell components 5b and 5c from upper, by direct pressure contact with the right-hand peripheral area of the plate 5a, said pressure member being held in position by a positioning screw 7 which is studded on the base plate 2 through an insulated distance piece 105 shown only schematically. A similar positioning means comprising similar components 6; 7 and 105 is provided at the left side of FIG. 2 for positioning the opposite side of the liquid crystal cell 5 and for establishing and maintaining optimum electrical connection between the terminal group 100b on the flexible printed circuit sheet 3 and the mating terminal group correspondingly provided on the lower surface of the upper protecting glass plate 5a, although not shown for avoiding crowded representation of the drawing.

Figure 4:
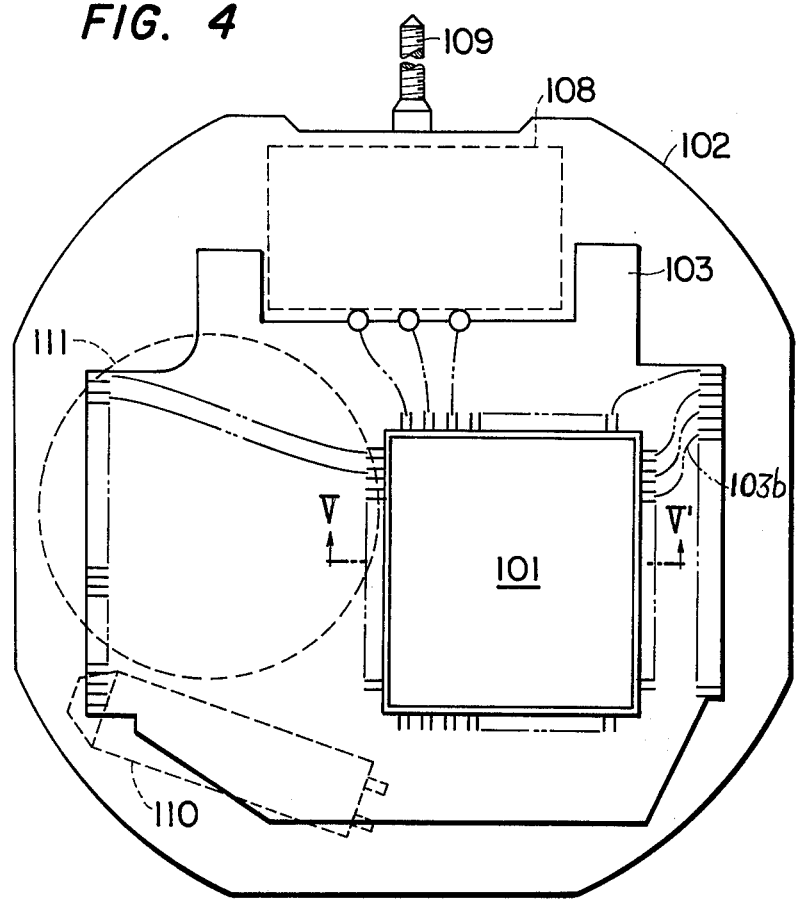
FIG. 4 is a similar view of FIG. 1, showing, however, a second embodiment of the invention.

The operation of the first embodiment of the invention so far shown and described is as follows:

When the watch movement operates, current flows from the battery, although not shown, the arrangement being similar to be shown in FIG. 4 in the second embodiment to disclose, when starting from the negative side thereof, through one of the conductive strips 3e, a related one of the connectors 1g and one of the related wire leads 1d''' to the input electrode, not shown, of the chip 1b for operating the integrated circuit included therein. The input voltage may preferably be 6 volts.

The integrated circuit comprises an electronic oscillator for the quartz oscillator which may be constructed as at 110 in FIG. 4, a series of requency dividers, preferably flip-flops, adapted for reducing the oscillating frequency, preferably 32 kHz, to 1 Hz, electronic counters adapted for the reduced frequencies, decoders for decoding the output signals of said counters into proper signals adapted for corresponding time display representations and a drive circuit for the drive of the liquid crystal display means. Since such integrated circuit chip of the structure and function described above has been already commercialized and very well known, the detailed description thereof may be omitted without misunderstanding of the present invention.

Counter-adjusting inputs from the switch block 8 are fed through conductive strips 3d to the respective counters included within the chip 1b. Outputs from said drive circuit are fed through conductive strips 3b; 3c and terminal groups 100a; 100b to the liquid crystal cell 5. One of said conductive strips 3e is so connected to the positive side of the battery as at 111, FIG. 4, through the base plate 2 for serving as the current return means. Although not shown, substantial part of the lower surface of flexible sheet proper 3a is attached fixedly to the bottom surface of said first recess 2a, for positioning of the flexible sheet unit 3 in position, by glueing or the like conventional fixing technique.

Thanks to the afore-mentioned structure and operation, it will be well understood that the IC-block can be effectively protected from adverse effects of outside mechanical shocks, dirts and atmospheric moisture, in addition to the avoidance of excess dimensional increase by the assembly of the block in the watch movement. Even in the completely assembled position of flexible printed sheet 3 and liquid crystal cell 5 in their vertically overlapped state as shown in FIG. 2, the overall effective thickness of the most vital constituents 1-5 of the watch movement amounts only to a 30%-plus thickness relative to the thickness of the base plate 2. According to our practical knowledge, the overall thickness of the watch movement embodying the structural principles governing the said first embodiment can be reduced by about 30% from the comparative conventional value, thereby minimizing otherwise unavoidable idle space in the movement. It will be further seen that with rather simpler design and arrangement of the related several blocks or the like subassembled constituents employed in the said first embodiment, the vital electronic unit of a full electronic digital watch movement can satisfy the dimension minimizing, thickness-reducing-and density increasing requirements. Further in the above embodiment, the side peripheries of the printed resilient sheet 3 are resiliently supported by the pressurized cooperation of the upper glass plate 5a of cell 5 and the resiliently mounting bars 4a; 4b in position, while establishing a reliable electric connection of the exposed electrodes of cell 5 with the corresponding conductive strips 3b; 3c. In addition, otherwise unavoidable conventional wire bond connections can be avoided by the provision of the improved resilient and isolated connections 3b', a resilient and reliable electrical as well as mechanical connection between the IC-block assembly and the connection pattern on the resilient sheet proper 3a and further with the liquid crystal cell can be assured according to the present embodiment. The assemblying steps and labor therefor can be substantially economized over the comparative prior art. On account of the flexibility of the sheet 3, the connection job with the cell 5 can be highly economized.

Figure 5:
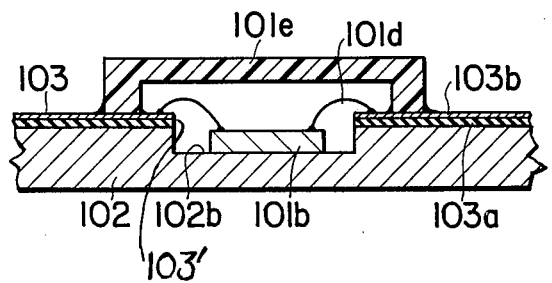
FIG. 5 is an enlarged section of part of the second embodiment shown in FIG. 4, taken along a section line V—V' shown therein.

In the second embodiment shown in FIGS. 4 and 5, numeral 102 represents a base plate schematically in its outline configuration in FIG. 4 and partially and in its section in FIG. 5, of the watch movement. This base plate 102 corresponds naturally to that denoted 2 in the foregoing first embodiment, but it is formed only with a single rectangular recess 102b which is similar to that denoted 2b in the foregoing embodiment.

Numeral 103 represents a flexible non-conductive resin sheet corresponding to that shown at 3 in the first embodiment, carries thereon a connection pattern comprising a number of conductive strips generally and representatively shown only at 103b. The sheet material is shown at 103a in the similar way to 3a in the first embodiment. This connection- or wiring pattern is substantially similar to that employed in the first embodiment and comprising conductive strips 3b, 3c, 3d and 3e, and thus, it is shown in FIG. 4 only in a still simplified way. The flexible sheet 103 is formed with a rectangular opening corresponding precisely with the plan configuration of said recess 102b, and fixedly attached to the upper surface of base plate 102 by means of glue agent such as epoxy resin.

A LS-IC chip 101b is perfectly similar to that shown at 1b in the first embodiment, said chip being, however, in the present embodiment, held in an up-and-down inverted position and firmly attached to the bottom surface of said recess 102b at its center and by means of glueing agent, preferably epoxy resin. There is a similar arrangement of a number of exposed electrodes similar to those of the foregoing chip 1b, on the upper surface thereof, in place of the lower surface in the foregoing embodiment, said electrodes being electrically connected through respective fine wire connectors 101d with the respective inner end portions of conductive strips 103b in one-to-one relationship as before.

Numeral 101e represents a rectangular shaped hollow protector similar to that shown at 1e in the first embodiment, made of synthetic resin or ceramic material and fixedly attached to the flexible sheet 103 from upper by means of glueing agent, preferably epoxy resin, so as to protect the chip 101b, connecting wires 101d and the bonded inner ends of conductive strips 103b, for the protection of these parts from outside mechanical shocks, atmospheric moisture and foreign matter.

Numeral 108 represents only schematically a switch block which has similar structure and function with those of the block shown at 8 in the first embodiment and adapted for being manually operated by means of a manipulating stem 109 which may be a same member as that shown at 9 in the foregoing. 110 and 111 represent a quartz and a battery, respectively, as referred to hereinbefore.

Further structure and further necessary components are similar to those of the first embodiment. As an example, a liquid crystal cell as that shown at 5 is also provided and arranged as before.

The operation of the present invention is substantially same as that of the first embodiment and thus, its detailed description may be omitted without better understanding thereof.

In the present embodiment, the LS-IC chip 101b is housed within the recess 102b of base plate 102 so that by the provision of this chip, the overall thickness dimension of the watch movement can not be increased in any way. In addition, the chip 101b, connecting wires 101d and inner connecting bonded end portions of the conductive strips 103b are well protected from adverse effects of outside mechanical shocks, atmospheric moisture and foreign matter, and thanks to the peculiar combination of said recess and protector. Otherwise the delicate elements or portions 101b, 101d and the like, referred to above, may be easily affected and damaged in long extended use of the watch movement. Therefore, the electronic function of the chip and its related parts can be maintained for a long time, and without appreciable change.

Figure 6:
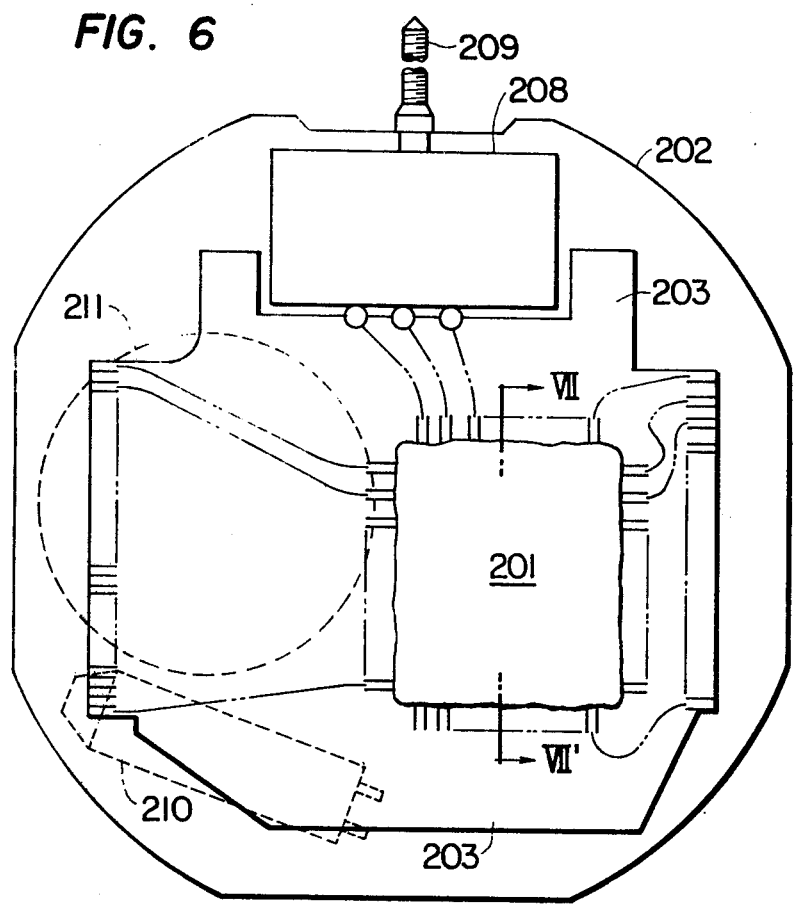
FIG. 6 is a similar view of FIG. 1, showing, however, a third embodiment of the invention.

Next, the third embodiment will be described with reference to FIGS. 6 and 7. It should be noted that the main constituents of the present embodiment are denoted respective same reference numerals with those used in the second embodiment, yet each being added with 100 for clear and quick identification and comparison.

Figure 7:
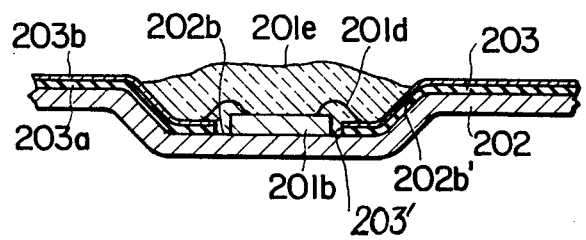
FIG. 7 is an enlarged section of part of the third embodiment, taken along a section line VII—VII' shown in FIG. 6.

In the present embodiment, the recess 202b has a bevelled sectional configuration as seen at 202b' in FIG. 7. The IC-chip 201b is glued to the upper surface of the recess and at the center thereof as before. The flexible sheet 203 comprises a sheet proper 203a and a connection wiring pattern of the same shape as before, including a number of conductive strips 203b as before, which have been shaped and prepared as those denoted 3a and 3b in the first embodiment, and through the printing and etching technique.

This flexible sheet 203 is fixedly attached by means of a glueing agent, preferably epoxy resin, and extends along the bevelled surface 202b of said recess 202b and covers from outside a rectangular outer portion of the upper surface of the recessed portion of base plate 202. For this purpose, the resilient sheet 203 is formed with a rectangular opening 203' encircling the rectangular outer periphery of chip 201b with evenly distributed small gaps.

A number of exposed electrodes, not shown, of the chip 201b are electrically connected, as before, with the inner end portions of the respective conductive strips 203b by the fine metal wires 201d in one-to-one relationship.

The chip, connecting wire leads and the inner end portions of the conductive strips extending along the bevelled surface 202b' are molded in a hardenable protecting resin mass 210e, preferably epoxy resin. The parts 208; 209; 210 and 211 are same as those denoted 108; 109; 110 and 111, respectively, in their structure and function, and thus, further detailed description may be omitted without sacrificing better understanding of the invention. The liquid crystal cell, although not shown, may be assembled with the present embodiment in the similar way to the mode of the first embodiment, this fact being equally applied to the second embodiment.

Figure 8:
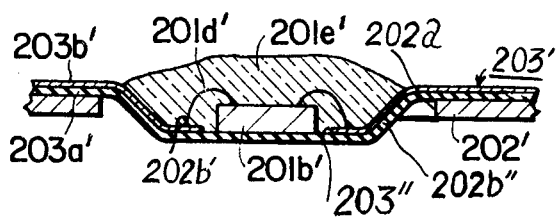
FIG. 8 is a similar view to FIG. 7, showing a modification from the third embodiment.

In the modification from the third embodiment and shown in FIG. 8, same or similar parts adopted herein with those employed in the third embodiment are denoted respective same reference numerals, yet each attached with a prime. In this modification, the flexible sheet proper 203a' is continuous and thus non-perforated. Instead, the inner ends of respective conductive strips 203b' forming as a whole the connecting pattern on the flexible sheet proper define in combination a rectangular cleared off surface on the bevellingly recessed portion 202b' of the sheet proper 203a', so as to leave an evenly distributed small gaps around the four side surface of the IC-chip 201b' which is fixedly attached to the bare surface of the bottom portion of recess 202b'. The flexible sheet 203' is attached fixedly on the upper surface of base plate 202' which is formed with a rectangular opening 202a in which the bevelled and bottom portions 202b''; 202b' of said flexible sheet 203' invade from upper as shown.

Under occasion, the bevelled portion 202b' or 202b'' may be formed as a vertically extending wall, although not shown.

Merits attained with the third embodiment may be substantially realized with use of the present modification. Molding mass 201e' is naturally same as that shown at 201e in the third embodiment in its nature and function.

By the provision of the recess 202b or 202b', the molding operation with resin mass 210e or 201e' can be easily simplified and assured.

In the following, referring to FIGS. 9 and 10, a manufacturing process of the flexible sheet will be explained in detail.

A flexible sheet 305 made of polyimide or the like resin material, previously perforated with two series of sprocket holes 312 for material feeding, is punched out a rectangular device opening 306 and attaching holes 307 as shown. The upper surface of this sheet 305 is covered with a thin copper film sheet 308 by a glueing agent, preferably epoxy resin, covering also said device opening 306, yet leaving blank at the sprocket holes 312. Then the known etching technique is applied so as to leave a connection or wiring pattern comprising a number of conductive strip groups 309; 310 and 311 which are comparative with conductive parts 3b; 3c; 3d; 3e; 100a; 100b and 3b' appearing in the first embodiment, thereby providing a printed flexible sheet 314 which is comparative with that denoted with 3 therein. More specifically, the conductive portions denoted representatively 310, in the present embodiment may constitute the terminal groups 100a and 100b in the foregoing first embodiment, adapted for electrical connection to the exposed electrodes of the liquid crystal cell.

Numeral 311 denotes connecting end portions or extensions from the main bonded portions of the conductive strips 309 which correspond those denoted with 309 in the first embodiment, said extensions extending a small distance over the device opening 306 in their free state. The numeral 309 represents generally the connecting or wiring pattern comprising a number of conductive strips, as was already referred to. The pattern 309 serves for connection to the exposed electrodes, not shown, on the quartz oscillator 313, only schematically shown as those denoted with 110 or 210 in the foregoing embodiments, fixing openings 307, switch block, not shown, which may be that shown at 8; 108 or 208 in the foregoing, and a battery, not shown, which may be that shown at 111 or 211 in the foregoing.

Two series of sprocket openings 312 serve for positioning of the flexible sheet or web 305 relative to the punching tool and die, not shown, and for stepwise feeding of the web, as will be more fully described hereinafter.

Numeral 321 represents the outline configuration of the flexible sheet as found upon the steps of coppersheet attaching, etching formation of the connecting or wiring pattern and punching. The extensions 311 from the pattern are bondedly connected in one-to-one relationship with the exposed electrodes 303'' on the board 301 which electrodes were, however, not shown in the foregoing several embodiments. The bonding material may preferably be solder as shown only schematically and representatively at 315 or a suitable alloy material which may provide an Au — Sn eutectic mixture or crystal.

Figure 9:
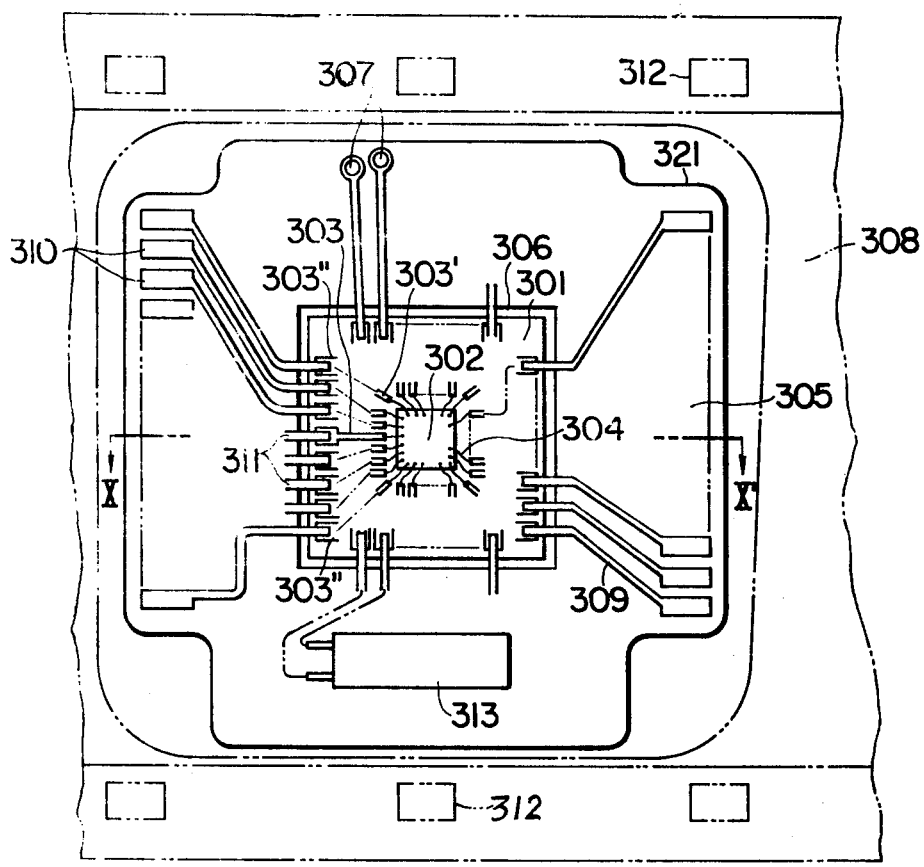
FIG. 9 is an enlarged plan of a standard printed circuit flexible sheet, usable with the first embodiment.
Figure 10:
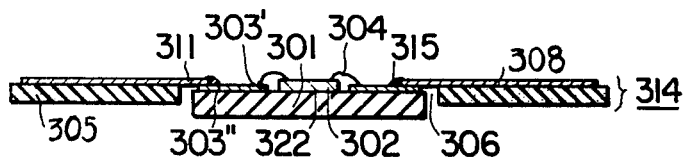
FIG. 10 is a section taken along a section line X—X' shown in FIG. 9.

More specifically, at the center portion of FIG. 9, a rectangular assembly combination of a ceramic board 301 and a LS-IC chip 302 is shown. These board and chip have been united together by glueing with epoxy resin or the like, as adopted before. On the board 301, there are formed a number of mutually independent metal connecting strips or electrodes shown only schematically and representatively at 303' and 303'' formed by the thick layer printing process known per se. The glued layer between the ceramic board and the chip is shown at 322 in FIG. 10. Electrodes on the chip 302 and the inner ends of metal strips 303' and 303'' are electrically connected in one-to-one relationship by fine metal wires 304 of Au; Al or the like by the bonding process, while the outer ends of said metal strips are electrically connected again in one-to-one relationship with respective conductive extensions 311 by the direct bonding or soldering process.

Figure 14:
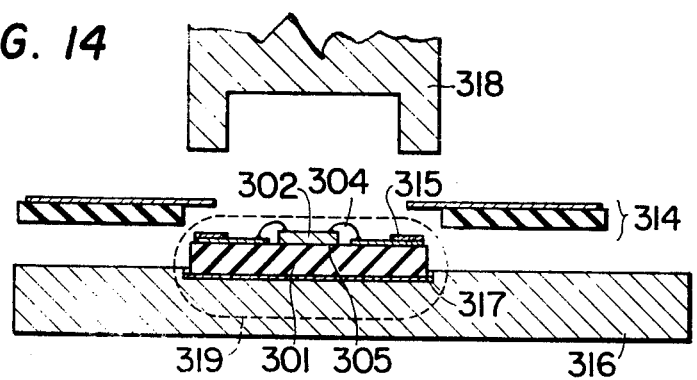
FIGS. 14 and 15 are schematic sectional views for the illustration of two stages during the rigid combination of said IC-block with said printed circuit flexible sheet.
Figure 15:
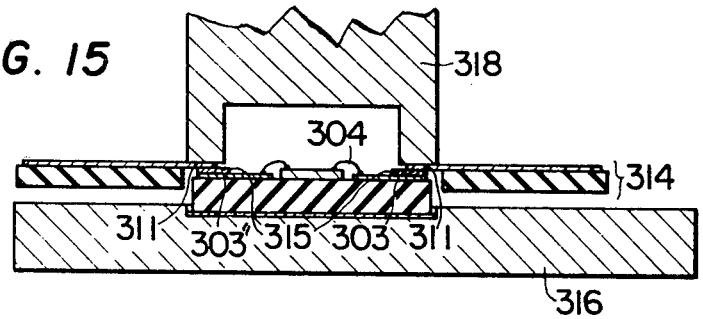

In FIGS. 14 and 15, two steps for the practical fitting of the IC-chip assembly in position is shown schematically in sectional representation, respectively.

In FIG. 14, numeral 319 represents an IC-block assembly, being shown as encircled by a chain-dotted line loop, while numeral 314 represents a flexible printed circuit sheet as before. Numeral 318 represents a vertically movable heated ram. For this purpose, the latter is fitted with an electric resistance coil, although not shown, for soldering or bonding at the same time a number of electrical connection points as at 315 shown in FIG. 10. Numeral 316 represents a stationary base plate which is formed with a recess 317 for holding a IC-chip 319. By lowering the heated ram 318 from the position shown in FIG. 14 to that shown in FIG. 15, solder pieces 315 placed on the connecting spots to be formed are caused to melt, so as to provide the corresponding flow-bonded portions, thereby the free extensions 311 being bonded with respective outer end portions of exposed thin electrodes or conductive strips 303". The cross-sectional configuration and area of the ram 318 at its lowermost working end have been selected so that it covers all the connection points simultaneously soldered. In this case, the width of the outer electrode or conductive strip 303" should preferably be made wider than the free extension 311 for assuring to realize a reliable soldered connection. For the same purpose, the length of the conductive strip or electrode 303" should preferably be selected to be longer than the free extending extension strip 311.

Figure 16:
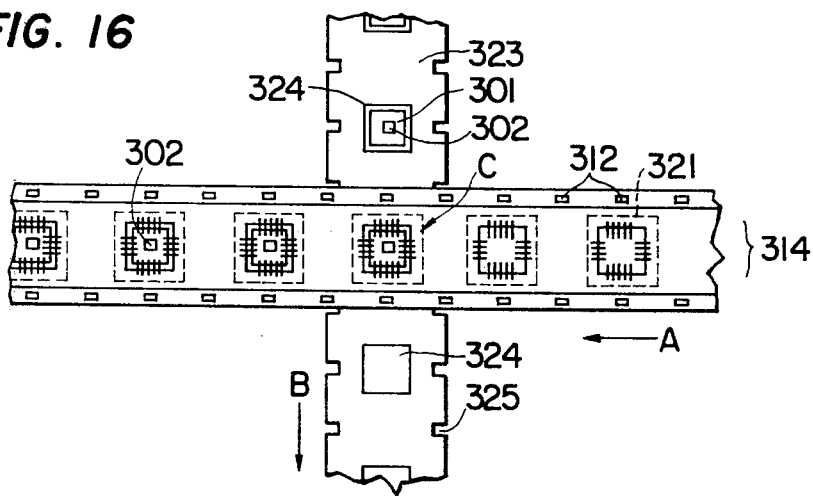
FIG. 16 is a schematic plan view illustrating successive combination steps of a series of IC-blocks with a series of printed circuit flexible sheets, drawn on a reduced scale relative to the foregoing views.

FIG. 16 illustrates a mass-production mode of the LS-IC block assembly forming an important core of the present invention. In this embodiment, an elongated and flexible printed circuit web 314 is fed stepwise in the direction of an arrow "A". This web 314 has been successively punched out a series of rectangular sections shown in dotted lines and reinserted with these once punched-out sections again in position at equal pitches one after another. Said stepwise and lengthwise feed of the web 314 is carried out by means of a pair of sprocket wheels, not shown, which are arranged to engage successively in successive pair of sprocket holes 312. as commonly known. On the other hand, a number of IC-block assemblies are successively held in a series of recesses 324 formed on a magazine tape 323 with equal pitches which tape is fed stepwise in the direction of an arrow "B" perpendicular to the first direction "A" and in synchronism with the stepwise feed motion of web 314. When the web 314 and the tape 323 are provisionally held stationary with a rectangular area 321 in registration with a recess 324, as shown at "C" in FIG. 16. The stepwise feed of the magazine tape 323 is carried out by a further pair of sprocket wheel, not shown, which are engageable with feed notches 325 formed in the both side edges of the tape with equal pitches as shown. At the working position "C", the uniting combination of a flexible printed circuit sheet 321 with a IC-block assembly 319 is carried out.

Figure 11:
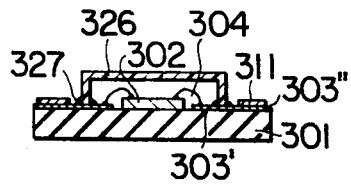
FIGS. 11-13 are respective sectional views to part of FIG. 10, showing several modifications from the IC-block shown therein.

A sample of IC-block assembly unit is shown in FIG. 11. This unit comprises a sub-assembly shown in FIG. 10, which is further added with a ceramic or plastic protector cap 326 attached sealingly and fixedly to the said sub-assembly by means of fused glass or the like fixing agent at 327, for the protecting purpose referred to hereinbefore. In this embodiment, the chip 302 is fixedly attached to the upper surface of the ceramic board 301 and a number of conducting strips 303" have been formed on the same upper surface by the circuit-printing process.

In a modification shown in FIG. 12, the chip assembly shown in FIG. 10 has been overturned up and down and the hollow protector 326 has been fixedly attached from below to the sub-assembly at the lower surface of the ceramic board 301.

Figure 13:
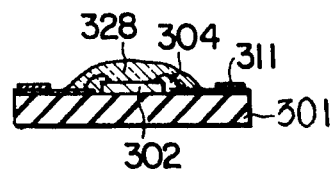

In FIG. 13, a further modified sub-assembly of the chip and the board is schematically shown. This modification is substantially similar to that shown in FIG. 7. In the present modification, however, the plain ceramic board 301 is used in place of the recessed base plate 202.

Figure 12:
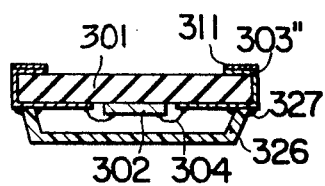

It will be apparent that with any of the modified subassemblies shown in FIGS. 11 — 13, satisfactory protection against outside mechanical shocks, atmospheric moisture and foreign matter can be assured.

Figure 17:
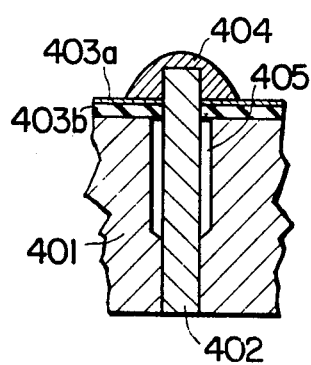
FIG. 17 is a sectional view of a part of FIG. 1, illustrated on a somewhat enlarged scale and taken along a section line XVII—XVII' shown therein.
Figure 18:
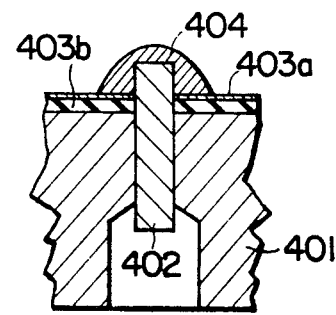
FIG. 18 is a similar view to FIG. 17, showing a comparative conventional structure.

In FIG. 17, an improved pin connection is shown, in comparison with a comparative conventional design shown in FIG. 18.

In these arrangements, numeral 401 represents only partially a base plate of the watch movement similar to that shown at 2 in FIG. 2. Numeral 403b represents only partially a resilient printed circuit sheet which is similar to that shown at in FIG. 2, said sheet being formed thereon a connecting or wiring pattern comprising a number of conductive strips 403a similar to those shown at 3a in FIG. 2. A conductive metallic pin 402 passes through the material of the base plate 401, the upper end projecting above the conductive strip 403a and soldered therewith at 404 by soldering.

In the conventional arrangement shown in FIG. 18, the material of the plate 401 is kept in contact even with the upper part of said pin 402. Heat applied to the solder will escape into the material of the base plate when soldering so that difficulty may be encountered in the elevation of temperature at the head of the pin.

In the improved arrangement shown in FIG. 17, an elongated air gap space 405 is provided along the upper part of said pin 402 so that dissipation of soldering heat towards the material of the base plate can substantially be prevented, thus providing a quick and efficient soldering possibility.

The embodiments of the invention in which an exclusive property or privilege is claimed are as follows:

1. A time piece structure comprising:
    a base plate including first means defining a recess thereon, said first means including second means defining a second recess within said first means;
    a insulated board of rectangular dimensions having upper and lower surfaces;
    an I.C.-chip with a plurality of electrodes, said chip being of rectangular dimensions less than said rectangular dimensions of said board and mounted on said lower surface of said board;
    film element means for providing a plurality of conducting paths along said lower surface of insulated boards, along said upper surface of said board corresponding to said lower surface paths, and for interconnecting electrically said corresponding upper and lower surface conducting paths;
    wire means for interconnecting each of said plurality of electrodes of said I.C.-chips with individual conducting paths of said film element means;
    cover means, affixed to the lower surface of said insulated board, for completely covering said I.C.-chip and said wire means and for at least partially covering said lower film element means;

a liquid crystal display cell, mounted on said base plate over said I.C.-chip, having electrodes; and a flexible non-conducting sheet mounted on said base plate sandwiching said insulated board into said first means with said cover means extending into said second means, said sheet including means for interconnecting said film element means with said liquid crystal display cell electrodes, said sheet bearing on said first means.

2. The apparatus of claim 1 wherein said element means comprises interconnected printed circuits on said upper and lower surfaces.

3. The apparatus of claim 1 wherein said wire means comprises fine wire connectors electrically bonding said electrodes to said film element means.

* * * * *